United States Patent
Chen et al.

(10) Patent No.: US 11,477,897 B2
(45) Date of Patent: Oct. 18, 2022

(54) SUPPORT FRAME AND LED DISPLAY SCREEN SYSTEM INCLUDING SUCH SUPPORT FRAME

(71) Applicants: SHENZHEN ABSEN OPTOELECTRONIC CO., LTD., Guangdong (CN); HUIZHOU ABSEN OPTOELECTRONIC CO., LTD., Guangdong (CN)

(72) Inventors: Chenchu Chen, Shenzhen (CN); Jiahong Lin, Shenzhen (CN)

(73) Assignees: SHENZHEN ABSEN OPTOELECTRONIC CO., LTD., Guangdong (CN); HUIZHOU ABSEN OPTOELECTRONIC CO., LTD., Guangdong (CN)

( * ) Notice: Subject to any disclaimer, the term of this patent is extended or adjusted under 35 U.S.C. 154(b) by 31 days.

(21) Appl. No.: 17/257,108

(22) PCT Filed: Mar. 2, 2020

(86) PCT No.: PCT/CN2020/077463
§ 371 (c)(1),
(2) Date: Dec. 30, 2020

(87) PCT Pub. No.: WO2021/174386
PCT Pub. Date: Sep. 10, 2021

(65) Prior Publication Data
US 2022/0053652 A1    Feb. 17, 2022

(51) Int. Cl.
*H05K 5/00*    (2006.01)
*H05K 5/02*    (2006.01)

(52) U.S. Cl.
CPC ......... *H05K 5/0217* (2013.01); *H05K 5/0017* (2013.01); *H05K 5/0021* (2013.01)

(58) Field of Classification Search
CPC combination set(s) only.
See application file for complete search history.

(56) References Cited

U.S. PATENT DOCUMENTS

| 10,537,032 B2 * | 1/2020 | Ran ......................... G09F 9/33 |
| 2010/0157513 A1 * | 6/2010 | Guo ..................... F16M 11/045 |
| | | 361/679.01 |

(Continued)

FOREIGN PATENT DOCUMENTS

| CN | 102829305 A | 12/2012 |
| CN | 206221927 U | 6/2017 |

(Continued)

OTHER PUBLICATIONS

Extended European Search Report for corresponding European patent application No. 208280123 dated Jun. 30, 2021, seven pages.

(Continued)

*Primary Examiner* — Hung S. Bui
(74) *Attorney, Agent, or Firm* — Brooks Kushman P.C.

(57) ABSTRACT

This application discloses a support frame and an LED display screen system including the support frame. An LED display screen includes a plurality of splicing units that are spliced to each other. The support frame includes a bracket and a first rod extending in a first direction. The bracket includes a second rod and a first connection assembly, and one end of the second rod is connected to the first rod and extends in a second direction. The first connection assembly includes a connection portion and a first positioning portion, and the connection portion is disposed on the other end of the second rod and is configured to form a detachable connection with the splicing unit

18 Claims, 15 Drawing Sheets

(56) References Cited

U.S. PATENT DOCUMENTS

| | | | | |
|---|---|---|---|---|
| 2011/0090410 A1* | 4/2011 | Ye | ............... | F16M 11/105 |
| | | | | 348/836 |
| 2012/0032038 A1* | 2/2012 | Ye | ............... | F16M 11/28 |
| | | | | 248/122.1 |
| 2017/0191607 A1* | 7/2017 | Huang | ............... | F16M 11/08 |

FOREIGN PATENT DOCUMENTS

| | | | |
|---|---|---|---|
| CN | 107270081 A | 10/2017 | |
| CN | 107403593 A | 11/2017 | |
| CN | 206893212 U | 1/2018 | |
| CN | 108682320 A | 10/2018 | |
| CN | 105952740 B | 11/2018 | |
| CN | 109114102 A | 1/2019 | |
| CN | 109545091 A | 3/2019 | |
| CN | 109654353 A | 4/2019 | |
| CN | 109668012 A | 4/2019 | |
| WO | 2013091755 A1 | 6/2013 | |
| WO | WO-2017120769 A1 | 7/2017 | |

OTHER PUBLICATIONS

International Search Report of the International Searching Authority issued in PCT/CN2020/077463 (in Chinese), dated Dec. 15, 2020; ISA/CN.

\* cited by examiner

SUPPORT FRAME AND LED DISPLAY SCREEN SYSTEM INCLUDING SUCH SUPPORT FRAME

CROSS-REFERENCE

This application is a U.S. National Phase application of International Application No. PCT/CN2020/077463, filed on Mar. 2, 2020, which is incorporated herein by reference in its entirety.

TECHNICAL FIELD

This application relates to the field of light-emitting diode (LED) display screen technologies, and in particular, to a support frame and an LED display screen system including the support frame.

BACKGROUND

At present, a large-screen LED display screen is usually formed by several splicing units. Due to limited connection strength between the splicing units, it is difficult to ensure splicing reliability of the whole display screen, especially for outdoor display screens subject to natural environmental challenges such as wind and rain. A current solution to this problem in the industry includes disposing one or more support frames for supporting the splicing units. However, the current support frames in the industry are complex in assembly and disassembly due to improper structural designs of the support frames.

TECHNICAL ISSUE

To overcome the disadvantage in the prior art, a purpose of this application is to provide a support frame more convenient and easier for assembly and disassembly, and an LED display screen system including the support frame.

TECHNICAL SOLUTION

To resolve the technical issue, the technical solutions adopted in embodiments of this application are as follows:

According to a first aspect, a support frame for an LED display screen is provided. The LED display screen includes a plurality of splicing units that are spliced to each other, and the support frame includes: a first rod extending in a first direction; and a bracket, where the bracket is connected to the first rod. The bracket includes: a second rod extending in a second direction, where one end of the second rod is connected to the first rod; and a first connection assembly, where the first connection assembly is connected to the other end of the second rod. The first connection assembly includes: a connection portion, configured to form a detachable connection with the splicing unit, where the connection portion is disposed at the other end of the second rod, and the connection portion, relative to the splicing unit, has at least a locking position and an unlocking position that are switchable; when the connection portion is in the locking position, the splicing unit and the connection portion are relatively fixed in a direction perpendicular to a connection plane of the splicing unit; and when the connection portion is in the unlocking position, the connection portion is detachable relative to the splicing unit; and a first positioning portion, where when the connection portion is in the locking position, the first positioning portion cooperates with the connection portion and secures the connection portion to the locking position.

In an embodiment, the first connection assembly further includes a first shaft, and the connection portion is rotatably connected to the first shaft.

In an embodiment, the first positioning portion forms a movable connection with the first shaft in a direction perpendicular to an axis of the first shaft.

In an embodiment, the first connection assembly further includes a second shaft, where the second shaft is connected to the first shaft in a direction perpendicular to the axis of the first shaft, and the first positioning portion is rotatably connected to the second shaft and is movable relative to the second shaft in an axial direction of the first positioning portion.

In an embodiment, the first connection assembly further includes a first biasing member, where when the first positioning portion moves in a third direction parallel to an axis of the second shaft, the first biasing member applies a biasing force opposite to the third direction to the first positioning portion.

In an embodiment, a surface of the connection portion is provided with a concave portion. The concave portion is recessed along a radial direction of the first shaft and extends along a circumferential direction of the first shaft, the second shaft passes through the concave portion, and a size of the concave portion along an axial direction of the first shaft is greater than a maximum radial size of the second shaft.

In an embodiment, a surface of the connection portion is further provided with a first fitting portion, and a surface of the first positioning portion is provided with a second fitting portion; and when the connection portion is in the locking position, the first fitting portion and the second fitting portion form a shaft-hole fit.

In an embodiment, the support frame further includes an operating portion configured to perform an operation, and the operating portion is connected to the connection portion and drives the connection portion to switch between the locking position and the unlocking position.

In an embodiment, the operating portion is rotatably connected to the connection portion, the operating portion rotates about a third shaft, and an axis of the third shaft is perpendicular to an axis of the first shaft.

In an embodiment, the operating portion is provided with a first gear portion, the connection portion is provided with a second gear portion, and the first gear portion cooperates with the second gear portion, so that the operating portion is fixed to a position when rotating to the position relative to the connection portion.

In an embodiment, the first connection assembly is rotatably connected to the second rod.

In an embodiment, a rotatable angle range of the first connection assembly relative to the second rod is greater than 0° and less than or equal to 120°.

In an embodiment, the rotatable angle range of the first connection assembly relative to the second rod is greater than 0° and less than or equal to 90°.

In an embodiment, the first connection assembly is provided with a third gear portion, the second rod is provided with a fourth gear portion, and the third gear portion cooperates with the fourth gear portion, so that the first connection assembly is fixed to a position when rotating to the position relative to the second rod.

In an embodiment, the bracket further includes a second connection assembly, the second connection assembly is fixedly connected to the first rod, and the bracket and the second connection assembly form a rotary connection.

In an embodiment, the second connection assembly includes a connection shaft and a connection body, the connection shaft and the bracket form a rotary connection, and the connection body and the first rod form a fixed connection.

In an embodiment, the bracket further includes a second positioning portion, and the second positioning portion is connected to the second rod and the connection body, so as to lock the bracket in a preset position relative to the connection assembly.

In an embodiment, one end of the first rod is provided with a connection sleeve and the other end is provided with a connection end, and a connection end of one first rod is detachably connected to a connection sleeve of the other first rod, so as to connect two support frames.

In an embodiment, one end of the first rod is further provided with a third positioning portion. The third positioning portion is close to the connection sleeve and the connection end, and is connected to at least one of the connection sleeve and the connection end, so as to fix a position of the connection sleeve and/or the connection end relative to the first rod.

According to a second aspect, an LED display screen system is provided, including an LED display screen, where the LED display screen includes a plurality of splicing units that are spliced to each other; and a support frame that is detachably connected to the splicing unit. The support frame includes: a first rod extending in a first direction; and a bracket, where the bracket is connected to the first rod. The bracket includes: a second rod extending in a second direction, where one end of the second rod is connected to the first rod; and a first connection assembly, where the first connection assembly is connected to the other end of the second rod. The first connection assembly includes: a connection portion, configured to form a detachable connection with the splicing unit, where the connection portion is disposed at the other end of the second rod, and the connection portion, relative to the splicing unit, has at least a locking position and an unlocking position that are switchable; when the connection portion is in the locking position, the splicing unit and the connection portion are relatively fixed in a direction perpendicular to a connection plane of the splicing unit; and when the connection portion is in the unlocking position, the connection portion is detachable relative to the splicing unit; and a first positioning portion, where when the connection portion is in the locking position, the first positioning portion cooperates with the connection portion and secures the connection portion to the locking position.

In an embodiment, the first connection assembly further includes a first shaft, and the connection portion is rotatably connected to the first shaft.

In an embodiment, the first positioning portion forms a movable connection with the first shaft in a direction perpendicular to an axis of the first shaft.

In an embodiment, the first connection assembly further includes a second shaft, where the second shaft is connected to the first shaft in a direction perpendicular to the axis of the first shaft, and the first positioning portion is rotatably connected to the second shaft and is movable relative to the second shaft in an axial direction of the first positioning portion.

In an embodiment, the first connection assembly further includes a first biasing member, where when the first positioning portion moves in a third direction parallel to an axis of the second shaft, the first biasing member applies a biasing force opposite to the third direction to the first positioning portion.

In an embodiment, a surface of the connection portion is provided with a concave portion. The concave portion is recessed along a radial direction of the first shaft and extends along a circumferential direction of the first shaft, the second shaft passes through the concave portion, and a size of the concave portion along an axial direction of the first shaft is greater than a maximum radial size of the second shaft.

In an embodiment, a surface of the connection portion is further provided with a first fitting portion, and a surface of the first positioning portion is provided with a second fitting portion; and when the connection portion is in the locking position, the first fitting portion and the second fitting portion form a shaft-hole fit.

In an embodiment, the splicing unit is provided with a fitting member, the fitting member and the splicing unit form a fixed connection or are formed integrally, and the fitting member cooperates with the connection portion to form a detachable connection.

In an embodiment, when the support frame is connected to the splicing unit, the connection portion and the fitting member form a rotary connection about the first shaft; and the connection portion is provided with a protruding portion in a radial direction of the first shaft, the fitting member is provided with a concave portion in the radial direction of the first shaft, and when the connection portion is in the locking position, the protruding portion cooperates with the concave portion.

In an embodiment, the first connection assembly is rotatably connected to the second rod.

A beneficial effect of the support frame for the LED display screen provided in the embodiments of this application lies in that the support frame in this application has a more concise and efficient connection structure with the splicing unit, so that assembly and disassembly of the support frame are more convenient and quick.

BRIEF DESCRIPTION OF DRAWINGS

To describe the technical solutions in the embodiments of this application more clearly, the following briefly describes the accompanying drawings required for describing the embodiments or exemplary technical descriptions. Apparently, the accompanying drawings in the following description show merely some embodiments of this application, and persons of ordinary skill in the art may still derive other drawings from these accompanying drawings without creative efforts.

DESCRIPTION OF EMBODIMENTS

To make the objectives, technical solutions, and advantages of this application clearer and more comprehensible, the following further describes this application in detail with reference to FIG. 1 to FIG. 16 and the embodiments. It should be understood that the specific embodiments described herein are merely used to explain the present invention but are not intended to limit this application.

It should be noted that when a component is "fastened to" or "disposed on" another component, the component may be placed directly on the another component or be placed indirectly on the another component. When a component is referred to as "being connected to" another component, the component may be connected directly or indirectly to the another component. Orientations or position relationships indicated by the terms "up", "down", "left", "right", and the like are based on orientations or position relationships shown in the accompanying drawings, and are merely intended for ease of description, rather than indicating or implying that an apparatus or a part referred to must have a particular orientation or must be constructed and operated in a particular orientation. Therefore, this shall not be construed as any limitation on this application. For those of ordinary skill in the art, the specific meanings of the foregoing terms can be understood according to a specific situation. The terms "first" and "second" are used only for ease of description and cannot be construed as indicating or implying relative importance or implicitly indicating a quantity of technical features. Unless otherwise specified, "plurality" means at least two.

To illustrate the technical solutions described in this application, the following provides descriptions in detail with reference to specific accompanying drawings and embodiments.

Figure 1:
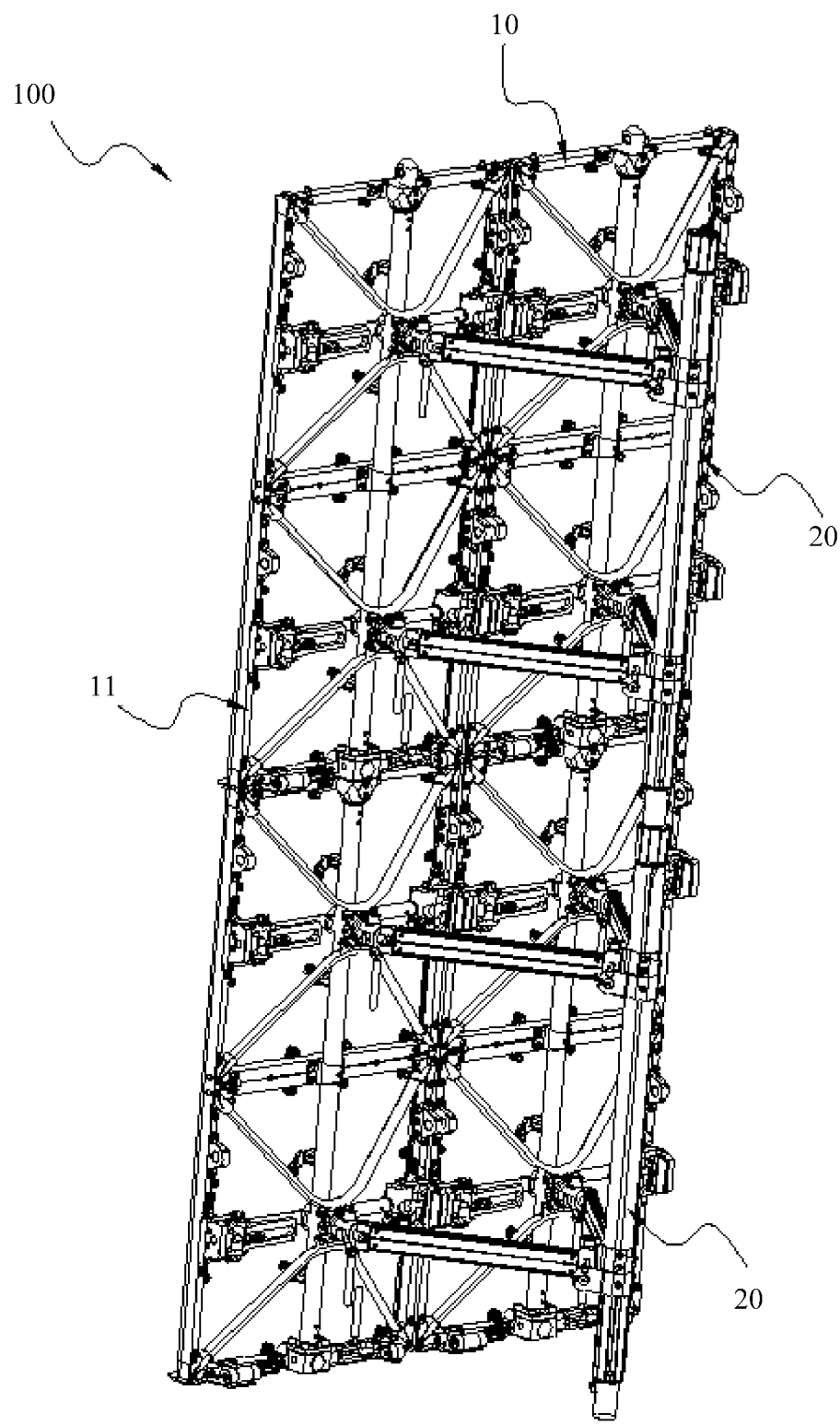
FIG. 1 is a schematic diagram of an LED display screen system according to an embodiment of this application, where two support frames are included.
Figure 2:
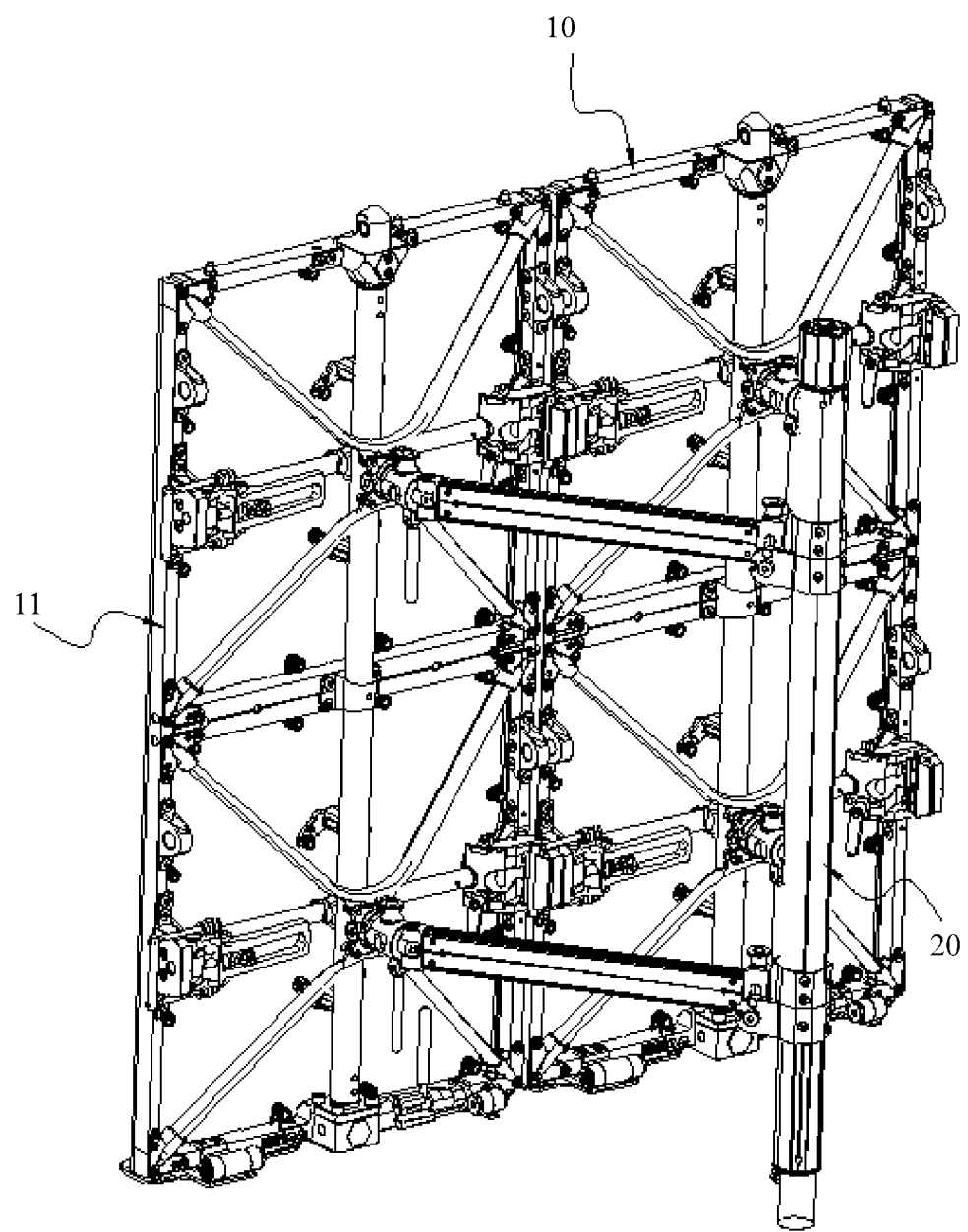
FIG. 2 is a partial schematic diagram of the LED display screen system in FIG. 1, where one support frame is included.

FIG. 1 and FIG. 2 illustrate an LED display screen system 100 according to Embodiment 1 of this application. The LED display screen system 100 includes an LED display screen 10 and a support frame 20 for supporting the LED display screen 10. In FIG. 1, the LED display screen system 100 includes two support frames 20 and eight splicing units 11 that are spliced to each other. In FIG. 2, the LED display screen system 100 includes one support frame 20 and four splicing units 11 that are spliced to each other. It should be noted that the LED display screen 10 in the LED display screen system 100 in this embodiment may include at least two splicing units 11 and at least one support frame 20. It should be noted that the splicing unit 11 in this application may be an LED display screen box or LED display screen module used for display, or may be another unit that forms an integral LED display screen with practical application value by splicing, such as a control box, a power distribution box, a tool box, and the like. This is not limited herein.

Figure 3:
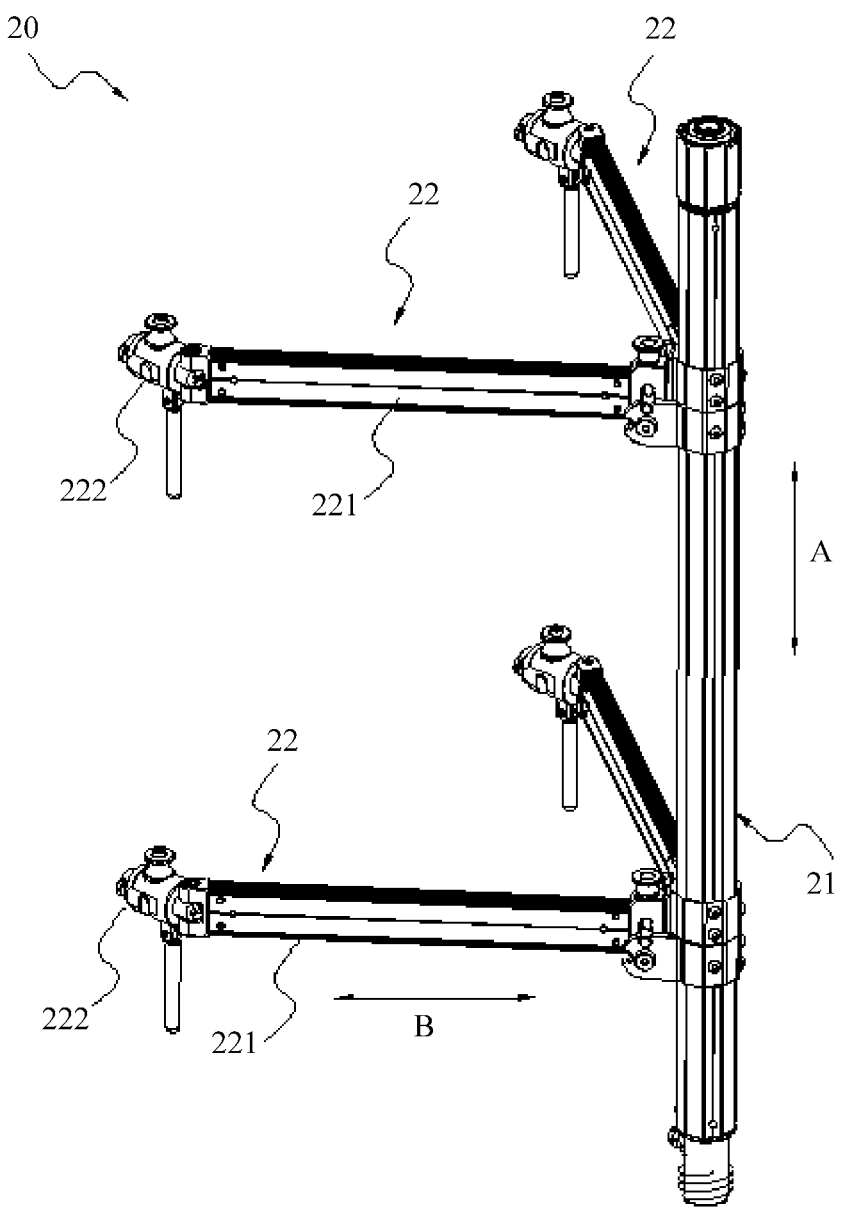
FIG. 3 is a perspective view of a support frame for the LED display screen system in FIG. 1, where the support frame is in an unfolded state.
Figure 4:
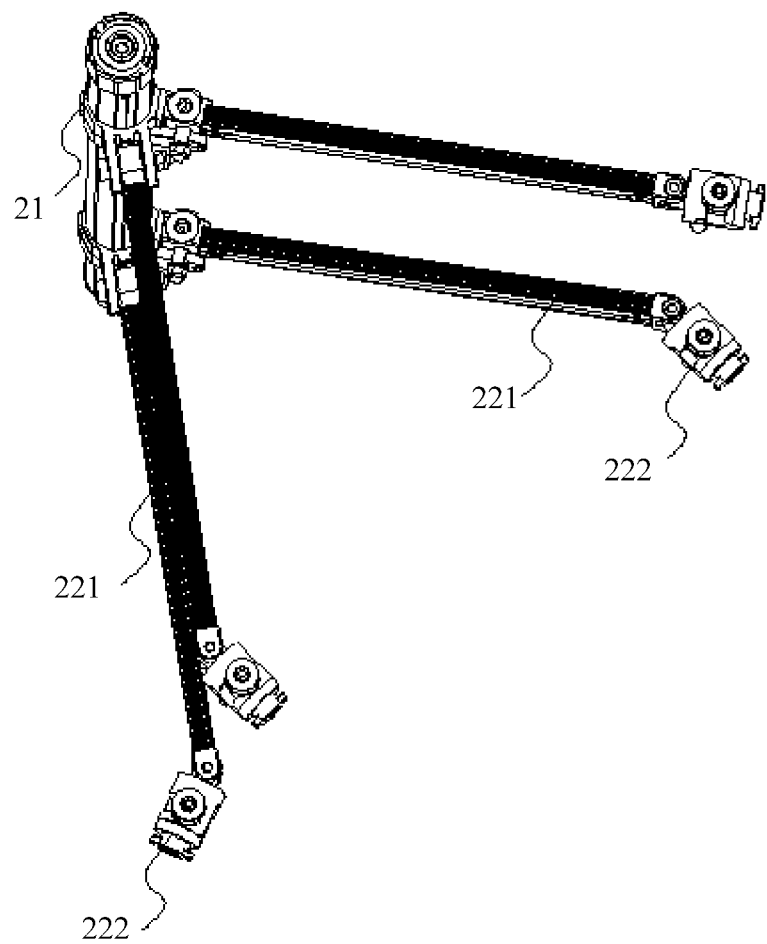
FIG. 4 is a perspective view of a partial structure of a support frame for the LED display screen system in FIG. 1, where the support frame is in an unfolded state.

As shown in FIG. 2 to FIG. 4, the support frame 20 includes a first rod 21 and a bracket 22, where the first rod 21 extends in a first direction, and the bracket 22 is connected to the first rod 21. Further, the bracket 22 is fixedly connected to the first rod 21 to enhance strength and rigidity of the entire support frame 20. The bracket 22 includes a second rod 221 and a first connection assembly 222, where the second rod 221 extends in a second direction. In this embodiment, the first rod 21 extends in a first straight-line direction A, the second rod 221 extends in a second straight-line direction B, and the first straight-line direction A and the second straight-line direction B are perpendicular to each other or skew. It can be understood that both the first direction and the second direction may be curve directions, that is, in other embodiments, the first rod 21 and second rod 221 may extend in a curve or in a partial curve form. One end of the second rod 221 is connected to the first rod 21, and the other end of the second rod 221 is connected to the first connection assembly 222. In this embodiment, four brackets 22 are connected to one first rod 21, with two brackets 22 as one group. The two brackets 22 are close to each other and connected to the first rod 21 to form one group. The support frames 20 in each group are spaced apart for a specific distance in the first straight-line direction A, and the distance is approximately equal to a vertical height of one splicing unit 11. It should be noted that one support frame 20 has at least two brackets 22, and positions of the two brackets 22 relative to the first rod 21 are not fixed, and are not necessarily close to each other in the first straight direction A as the two brackets 22 in this embodiment.

Figure 5:
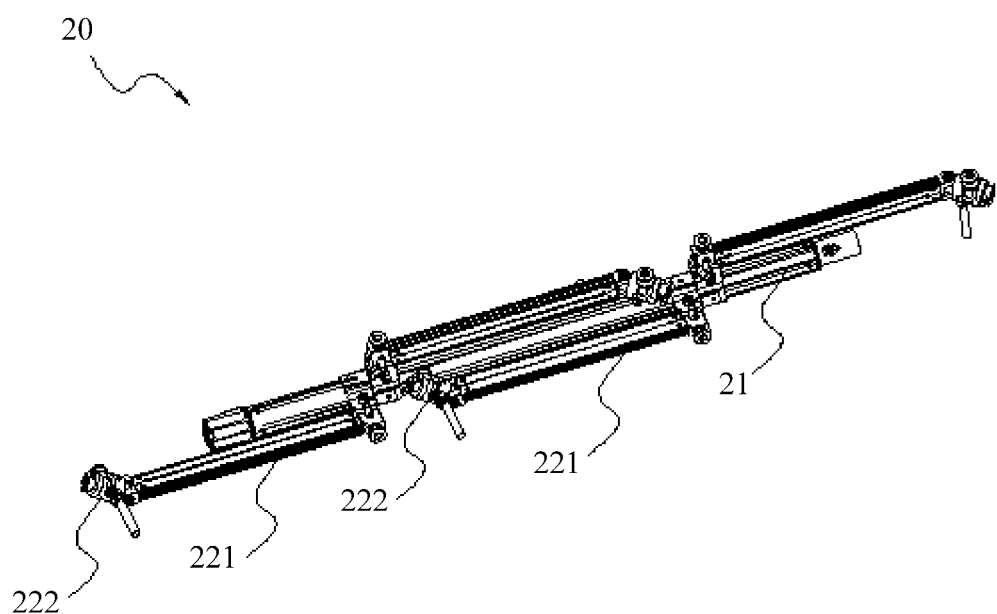
FIG. 5 is a perspective view of a support frame for the LED display screen system in FIG. 1, where the support frame is in a folded state.

As shown in FIG. 3 to FIG. 5, the support frame 20 has an unfolded state and a folded state. The support frames 20 in FIG. 3 and FIG. 4 are in the unfolded state and the support frame 20 in FIG. 5 is in the folded state. Specifically, the bracket 22 forms a movable connection relative to the first rod 21, and further, the bracket 22 forms a rotary connection relative to the first rod 21. When the bracket 22 rotates relative to the first rod 21 until the second rod 221 is parallel to the first rod 21, the support frame 20 is in the folded state. When the bracket 22 rotates relative to the first rod 21 until the second rod 221 is not parallel to the first rod 21, the support frame 20 is in the unfolded state. In this embodiment, when the support frame 20 is in the unfolded state, the second rod 221 is substantially perpendicular to the first rod 21, that is, an angle formed between the second rod 221 and the first rod 21 is about 90°. In another embodiments, when the support frame 20 is in the unfolded state, the angle formed between the second rod 221 and the first rod 21 may be another angle value. In addition, the two brackets 22 in this embodiment are close to each other and mounted to the first rod 21. When the support frame 20 is in the unfolded state, the two brackets 22 close to each other are basically at a same height in the first straight direction A, that is, the two brackets 22 can be connected to two horizontally adjacent splicing units 11 on a same horizontal line. Such design facilitates connection of two horizontally adjacent splicing units 11, and also ensures a same structure for the two horizontally adjacent splicing units 11, with no need to make structural adjustment to accommodate a height difference between different brackets 22 in the first straight-line direction A.

Figure 6:
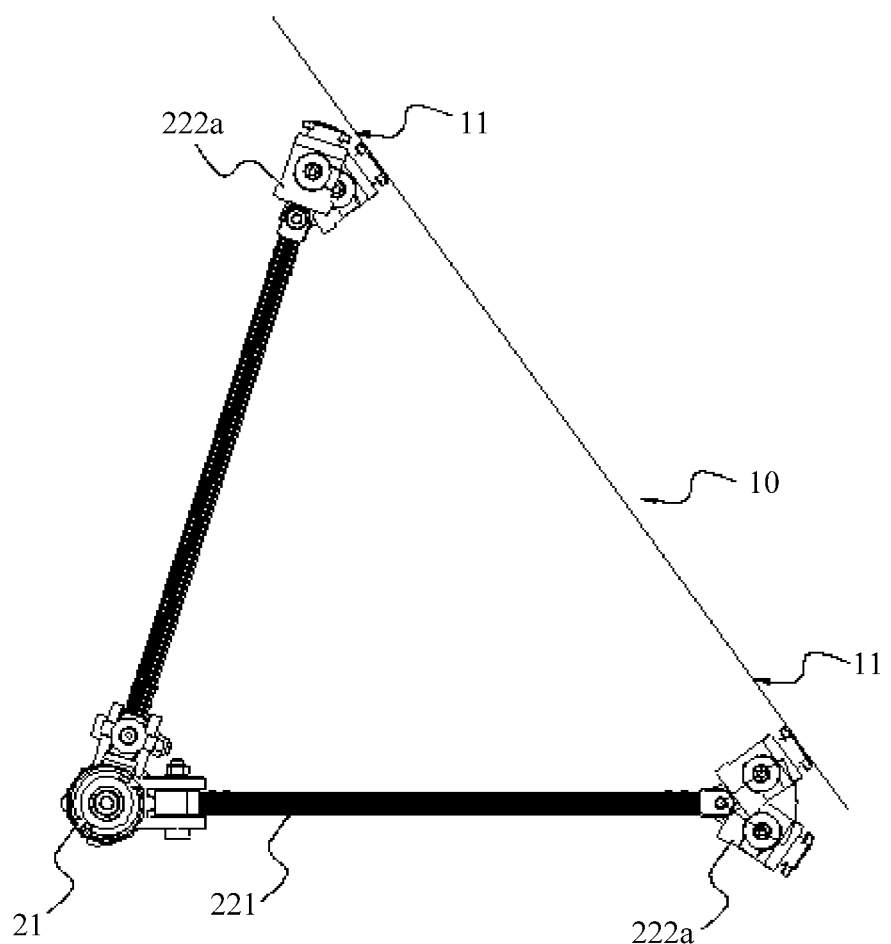
FIG. 6 is a planar schematic diagram of a support frame and a display screen for the LED display screen system in FIG. 1, where a first connection assembly is located at a different angle relative to a second rod.
Figure 7:
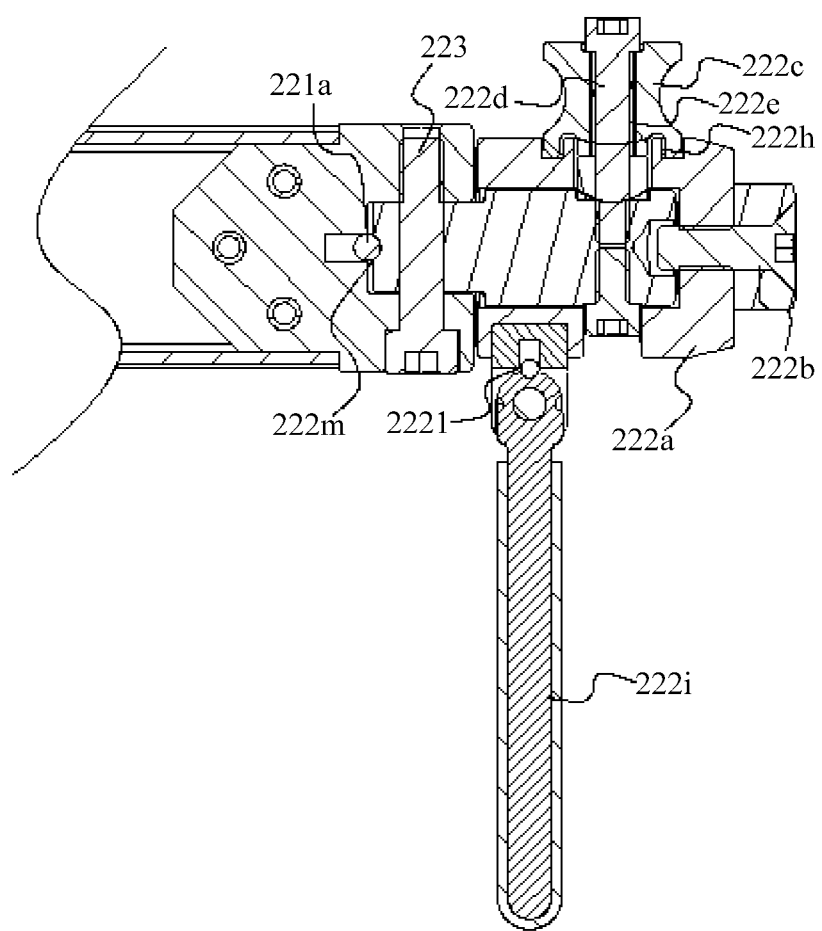
FIG. 7 is a cross-sectional view of a first connection assembly and a portion of a second rod that are of a support frame of the LED display screen system in FIG. 1.
Figure 8:
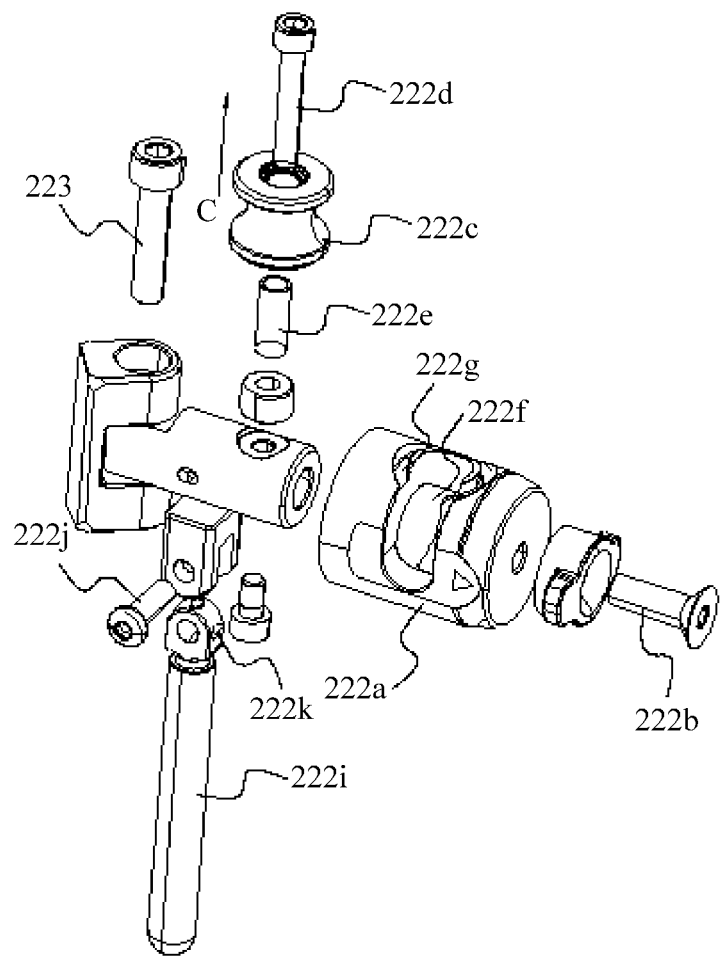
FIG. 8 is an exploded view of a first connection assembly and a portion of a second rod that are of a support frame of the LED display screen system in FIG. 1.

As shown in FIG. 6 to FIG. 8, the first connection assembly 222 includes a connection portion 222a. The connection portion 222a is configured to form a detachable connection with the splicing unit 11. The connection portion 222a is disposed at the other end of the second rod 221. The connection portion 222a, relative to the splicing unit 11, has at least a locking position and an unlocking position that are switchable. When the connection portion 222a is in the locking position, the splicing unit 11 and the connection portion 222a are relatively fixed in a direction perpendicular to a connection plane of the splicing unit 11. When the connection portion 222a is in the unlocking position, the connection portion 222a is detachable relative to the splicing unit 11.

The first connection assembly 222 further includes a first shaft 222b, and the connection portion 222a is rotatably connected to the first shaft 222b. Specifically, the connection portion 222a rotates about an axis of the first shaft 222b, and a rotation angle is not limited. The connection portion 222a has at least one locking position and one unlocking position relative to the splicing unit 11. When the connection portion 222a rotates to one or more angles relative to the first shaft 222b, the connection portion 222a is in the locking position, and when the connection portion 222a rotates to one or more angles relative to the first shaft 222b, the connection portion 222a is in the unlocking position. In this embodiment, the connection portion 222a has one locking position and one unlocking position relative to the splicing unit 11, and when the connection portion 222a is switched from the locking position to the unlocking position, a rotation angle relative to the first shaft 222b is about 90°.

The first connection assembly 222 further includes a first positioning portion 222c. When the connection portion 222a is in the locking position, the first positioning portion 222c cooperates with the connection portion 222a and secures the connection portion 222a to the locking position. To be specific, when the connection portion 222a is in the locking position relative to the splicing unit 11, the connection portion 222a cooperates with the splicing unit 11, so that the splicing unit 11 and the connection portion 222a are relatively fixed in the direction perpendicular to the connection plane of the splicing unit 11, or are relatively fixed in a direction parallel to the axis of the first shaft 222b. On this basis, the first positioning portion 222c cooperates with the connection portion 222a, so that the splicing unit 11 and the connection portion 222a are relatively fixed in the direction perpendicular to the connection plane of the splicing unit 11, or are relatively fixed in a circumferential direction of the first shaft 222b, so as to implement a fixed connection between a the splicing unit 11 and the connection portion 222a.

The first positioning portion 222c forms a movable connection with the first shaft 222b in a direction perpendicular to the axis of the first shaft 222b, and a user can move the first positioning portion 222c relative to the connection portion 222a by operating the first positioning portion 222c. In this embodiment, the first connection assembly 222 further includes a second shaft 222d, and the second shaft 222d is connected to the first shaft 222b in the direction perpendicular to the axis of the first shaft 222b. The first positioning portion 222c is rotatably connected to the second shaft 222d and is movable relative to the second shaft 222d in an axial direction of the first positioning portion 222c. Specifically, the user may operate the first positioning portion 222c, so that the first positioning portion 222c slides back and forth along an axial direction of the second shaft 222d. In this way, the first positioning portion 222c and the connection portion 222a cooperate with or separate from each other. The second shaft 222d is perpendicular to the first shaft 222b, the second shaft 222d passes through the first shaft 222b, and the second shaft 222d protrudes from the first shaft 222b in a radial direction of the first shaft 222b. Therefore, on the basis of the structure of the connection portion 222a itself, the second shaft 222d limits a rotational range of the connection portion 222a about the first shaft 222b. Specifically, the rotational range of the connection portion 222a about the first shaft 222b is 0° to 90°, and the locking position and the unlocking position of the connection portion 222a correspond to the positions of 0° to 90°, respectively.

The first connection assembly 222 further includes a first biasing member 222e, where when the first positioning portion 222c moves in a third direction C parallel to an axis of the second shaft 222d, the first biasing member 222e applies a biasing force opposite to the third direction C to the first positioning portion 222c. The first biasing member 222e may be an elastic member. In this embodiment, the first biasing member 222e is a spring. When the first positioning portion 222c is moved from an initial position along the third direction C parallel to the axis of the second shaft 222d under the effect of an external force, the spring is in a stretched state and applies an elastic force opposite to the third direction C to the first positioning portion 222c. When the external force is stopped from applying to the first positioning portion 222c, the spring returns to its original length under the effect of the elastic force, so as to drive the first positioning portion 222c back to the initial position. The third direction C herein is a direction extending away from the axis of the first shaft 222b along the radial direction of the first shaft 222b, and the initial position is a position of the first positioning portion 222c closest to the connection portion 222a. It can be understood that the first biasing member 222e may alternatively be a structure other than a spring, provided that the foregoing force effect can be applied to the first positioning portion 222c.

A surface of the connection portion 222a is provided with a concave portion 222f, where the concave portion 222f is recessed along a radial direction of the first shaft 222b and extends along a circumferential direction of the first shaft 222b, the second shaft 222d passes through the concave portion 222f, and a size of the concave portion 222f along the axial direction of the first shaft 222b is greater than a maximum radial size of the second shaft 222d. Specifically, the concave portion 222f is a groove disposed on a side surface of the connection portion 222a, and the side surface is a surface in the circumferential direction of the first shaft 222b. The groove is provided to mainly ensure that the connection portion 222a can still rotate about the first shaft 222b at an angle in a case in which the second shaft 222d intersecting the first shaft 222b is disposed. Specifically, two discontinuous grooves are provided in the side of the connection portion 222a along the circumferential direction of the first shaft 222*b*, the two grooves are centrally symmetrical relative to the first shaft 222*b*, and a central angle corresponding to an arc length of each groove extending along the circumferential direction of the first shaft 222*b* is about 90°. A recess depth of the groove along the radial direction of the first shaft 222*b* is not limited, and a height of the groove along the axial direction of the first shaft 222*b* is greater than a radial size of a portion, protruding out of the first shaft 222*b*, of the first shaft 222*b*.

The surface of the connection portion 222*a* is further provided with a first fitting portion 222*g*, and a surface of the first positioning portion 222*c* is provided with a second fitting portion 222*h*; and when the connection portion 222*a* is in the locking position, the first fitting portion 222*g* and the second fitting portion 222*h* form a shaft-hole fit. Specifically, the first fitting portion 222*g* is located on a side surface of the connection portion 222*a*, and the second fitting portion 222*h* is disposed on a surface of the first positioning portion 222*c* that is in contact with the connection portion 222*a*. In this embodiment, both the first fitting portion 222*g* and the second fitting portion 222*h* are approximately circular grooves, and the two circular grooves are different in radial size, so that the first fitting portion 222*g* and the second fitting portion 222*h* are engaged with each other to form at least two shaft-hole fits.

The connection assembly 222 further includes an operating portion 222*i* configured to perform an operation, and the operating portion 222*i* is connected to the connection portion 222*a* and drives the connection portion 222*a* to switch between the locking position and the unlocking position. In this embodiment, the operating portion 222*i* is a handle connected to the connection portion 222*a*, facilitating holding by the user to drive the connection portion 222*a* to rotate about the first shaft 222*b*. It can be understood that in other embodiments, the operating portion 222*i* may be other structures such as a twist, a knob, or a trigger, which is not limited herein. Further, the operating portion 222*i* is rotatably connected to the connection portion 222*a*, the operating portion 222*i* rotates about the third shaft 222*j*, and an axis of the third shaft 222*j* is perpendicular to the axis of the first shaft 222*b*. In the circumferential direction of the first shaft 222*b*, the operating portion 222*i* is fixed relative to the connection portion 222*a*, but the operating portion 222*i* may rotate about the third shaft 222*j* in a plane parallel to the axis of the first shaft 222*b*. In such design, the operating portion 222*i* can be in a variety of forms relative to the connection portion 222*a*. When the operating portion 222*i* is unfolded, the operating portion 222*i* extends in a direction perpendicular to the first shaft 222*b* for convenient operation. When the operating portion 222*i* is folded, the operating portion 222*i* extends in a direction parallel to the first shaft 222*b* for convenient storage.

In addition, the operating portion 222*i* is further provided with a first gear portion 222*k*, the connection portion 222*a* is provided with a second gear portion 222*l*, and the first gear portion 222*k* cooperates with the second gear portion 222*l*, so that the operating portion 222*i* is fixed to a position when rotating to the position relative to the connection portion 222*a*. Further, at least two second gear portions 222*l* each cooperate with the first gear portion 222*k*, so that the operating portion 222*i* is fixed to a plurality of positions when rotating to the positions relative to the connection portion 222*a*. Alternatively, at least two first gear portions 222*k* each cooperate with the second gear portions 222*l*, so that the operating portion 222*i* is fixed to a plurality of positions when rotating to the positions relative to the connection portion 222*a*.

In this embodiment, the first gear portion 222*k* is a groove provided in a surface of an end of the operating portion 222*i*, the second gear portion 222*l* is a ball cooperating with the groove, and the ball is fixedly connected to the connection portion 222*a*. Specifically, there are at least two grooves. In this embodiment, there are three grooves, respectively corresponding to two positions, parallel to the first shaft 222*b*, of the handle and a position perpendicular to the first shaft 222*b* for 90°. In an optional implementation, the first gear portion may be a ball disposed on the surface of the end of the operating portion, and the second gear portion is a groove provided in the connection portion. It can be understood that specific structures of the first gear portion and the second gear portion are not limited to the foregoing two implementations.

The first connection assembly 222 is rotatably connected to the second rod 221. In this embodiment, the first connection assembly 222 rotates about a fourth shaft 223 in a plane perpendicular to an extension direction (namely, the first straight-line direction A) of the first rod 21. In an optional implementation, the first connection assembly rotates about the fourth shaft in a plane parallel to the extension direction (namely, the first straight-line direction) of the first rod. In another optional implementation, the first connection assembly is hinged to the second rod, and the first connection assembly may rotate in a plurality of directions relative to the second rod. The first connection assembly 222 rotates about the fourth shaft 223, so that the first connection assembly 222 can be switched between different positions relative to the second rod 221, to match a variety of different forms of the LED display screen 10, for example, such as a planar LED display screen 10 and a curved LED display screen 10.

Four first connection assemblies 222 (the operating portions 222*i* are not shown) in FIG. 6 form different angles relative to the second rod 221. A rotatable angle range of the first connection assembly 222 relative to the second rod 221 is greater than 0° and less than or equal to 20°. Further, a rotatable angle range of the first connection assembly 222 relative to the second rod 221 is greater than 0° and less than or equal to 90°. In this embodiment, the rotation angle of the first connection assembly 222 relative to the second rod 221 is approximately 70°. The first connection assembly 222 is provided with a third gear portion 222*m*, the second rod 221 is provided with a fourth gear portion 221*a*, and the third gear portion 222*m* cooperates with the fourth gear portion 221*a*, so that the first connection assembly 222 is fixed to a position when rotating to the position relative to the second rod 221. Further, at least two third gear portions 222*m* cooperate with the fourth gear portion 221*a*, so that the first connection assembly 222 is fixed to a plurality of positions when rotating to the positions relative to the second rod 221. Alternatively, at least two fourth gear portions 221*a* cooperate with the third gear portion 222*m*, so that the first connection assembly 222 is fixed to a plurality of positions when rotating to the positions relative to the second rod 221.

In this embodiment, the third gear portion 222*m* is a groove provided in the connection portion 222*a*, the fourth gear portion 221*a* is a ball cooperating with the groove, and the ball is fixedly connected to the second rod 221. Specifically, there are at least two grooves. In this embodiment, there are three recesses, respectively corresponding to a position in which the first shaft 222*b* is parallel to or overlapped with the extension direction of the second rod 221 and positions in which the first shaft 222*b* form +35° and −35° relative to the extension direction of the second rod 221. As shown in FIG. 6, when the first shaft 222*b* forms +35° or −35° relative to the extension direction of the second rod 221, the connection portion 222a forms a surface contact with the planar LED display screen 10. In an optional implementation, the third gear portion may be a ball disposed on the surface of the second rod, and the fourth gear portion is a groove provided in the connection portion. It can be understood that specific structures of the third gear portion and the fourth gear portion are not limited to the foregoing two implementations.

Figure 9:
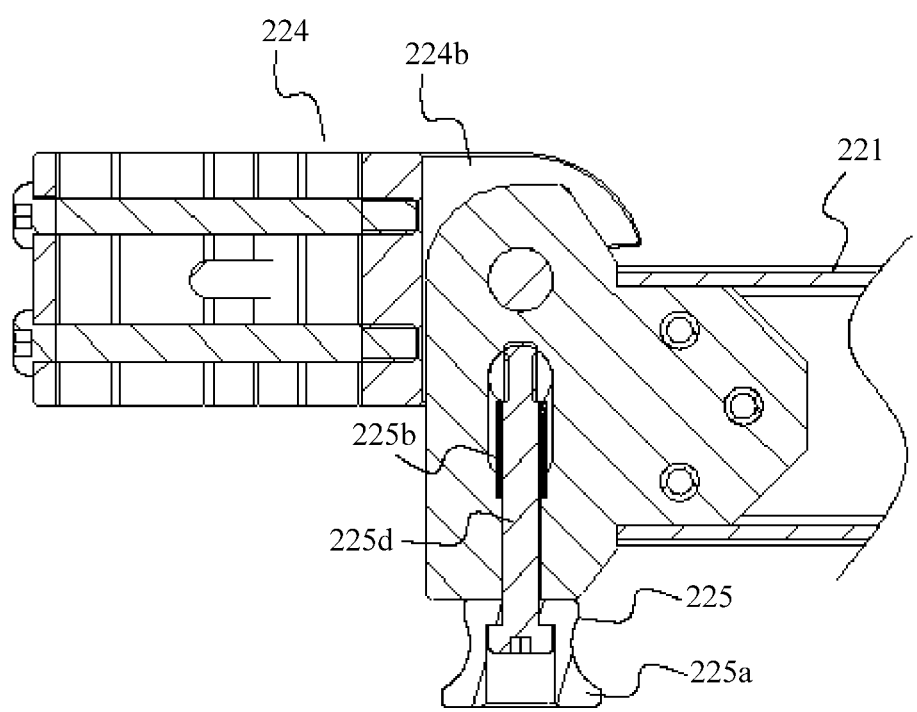
FIG. 9 is a cross-sectional view of a second connection assembly and a portion of a second rod that are of a support frame of the LED display screen system in FIG. 1.
Figure 10:
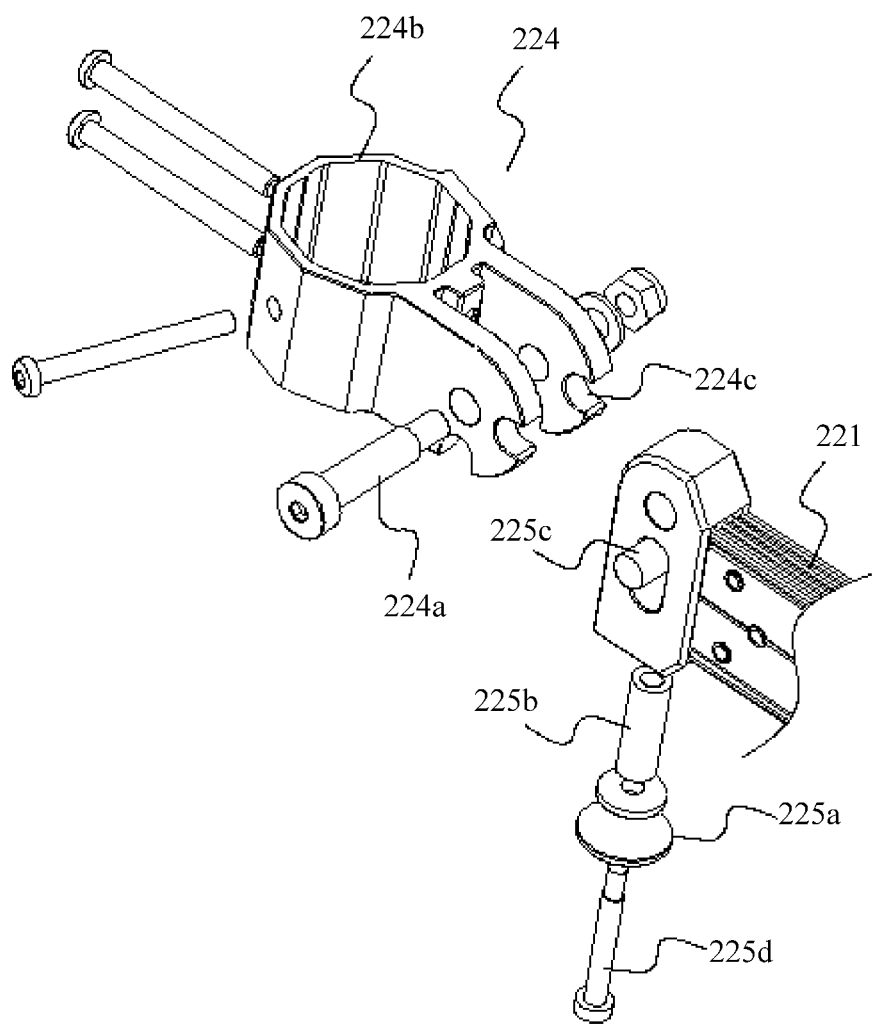
FIG. 10 is an exploded view of a second connection assembly and a portion of a second rod that are of a support frame of the LED display screen system in FIG. 1.

As shown in FIG. 2, FIG. 9, and FIG. 10, the bracket 22 further includes a second connection assembly 224, the second connection assembly 224 is fixedly connected to the first rod 21, and the bracket 22 and the second connection assembly 224 form a rotary connection. The second connection assembly 224 is connected to the first rod 21 and the bracket 22, and the first rod 21 and the second connection assembly 224 form a fixed connection with the second connection assembly 224 by using fasteners. Further, the first rod 21 and the second connection assembly 224 form a detachable connection with the second connection assembly 224 by using fasteners. In this embodiment, the fasteners include screws, nuts, bolts, and the like. The second connection assembly 224 includes a connection shaft 224a and a connection body 224b. The connection shaft 224a and the bracket 22 form a rotary connection, the connection body 224b and the first rod 21 form a fixed connection, and the connection shaft 224a is installed in the connection body 224b. An axis of the connecting shaft 224a is perpendicular to the first rod 21, so that the bracket 22 can rotate in a plane parallel to the first rod 21.

The bracket 22 further includes a second positioning portion 225, and the second positioning portion 225 is connected to the second rod 221 and the connection body 224b, so as to lock the bracket 22 in a preset position relative to the connection assembly. In this embodiment, the bracket 22 can be at least locked in a position parallel to the first rod 21 and a position perpendicular to the first rod 21. The second connection assembly 224 is provided with at least two third fitting portions 224c that cooperate with the second positioning portion 225. When the bracket 22 rotates to the foregoing two positions, the third fitting portions 224c each cooperate with the second positioning portion 225.

Specifically, the second positioning portion 225 is mounted to the end of the second rod 221, and the second positioning portion 225 includes a T-type bar, a holding portion 225a, and a second biasing member 225b. At least a portion of the T-type bar is disposed inside a housing of the second rod 221. The T-type bar includes a horizontal bar 225c and a vertical bar 225d. The holding portion 225a is mounted to the vertical bar 225d, the second biasing member 225b is mounted between the housing of the second rod 221 and the horizontal bar 225c, and the horizontal bar 225c cooperates with the third fitting portion 224c. The second biasing member 225b is specifically an elastic member, and in this embodiment, is a spring fitted to the surface of the vertical bar 225d. When an external force is applied to the holding portion 225a to change space between the horizontal bar 225c and the housing of the second rod 221, the second biasing member 225b applies a biasing force opposite to the operation direction to the horizontal bar 225c. When applying the external force is stopped, the second positioning portion 225 returns to its original position under the effect of the biasing force. The original position is a position in which the second positioning portion 225 cooperates with the third fitting portion 224c.

In this embodiment, the third fitting portion 224c is a groove provided in the second connection assembly 224, and is specifically a groove provided above the connection body 224b. The horizontal bar 225c and the groove form a shaft-hole fit, so that the bracket 22 is fixed in a circumferential direction of the connection shaft 224a relative to the first rod 21. There are two groups of grooves in one connecting body 224b, and each group of grooves includes at least one groove. An opening direction of one group of grooves is parallel to the extension direction of the first rod 21, and an opening direction of the other group of grooves is perpendicular to the extension direction of the first rod 21, so that the bracket 22 can be folded or unfolded relative to the first rod 21. In addition, as shown in FIG. 5, two brackets 22 that are mounted close to each other are folded in opposite directions, so as to prevent the bracket 22 from interfering with the connection body during folding, thereby facilitating storage and transportation.

Figure 11:
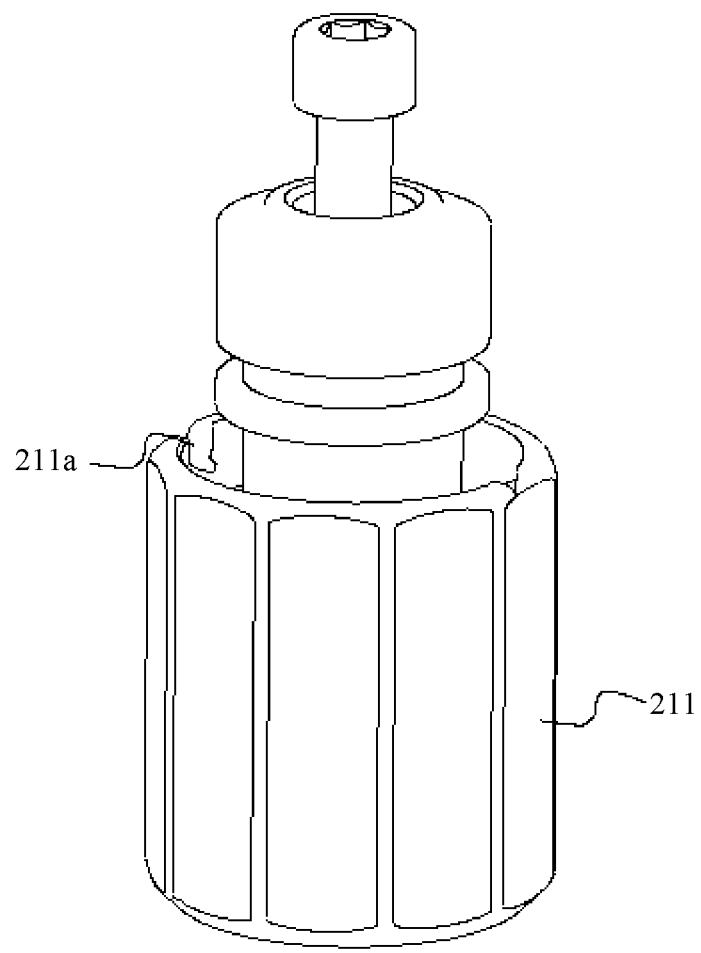
FIG. 11 is a schematic diagram of one end, on which a connection sleeve is disposed, of a first rod of a support frame of the LED display screen system in FIG. 1.
Figure 12:
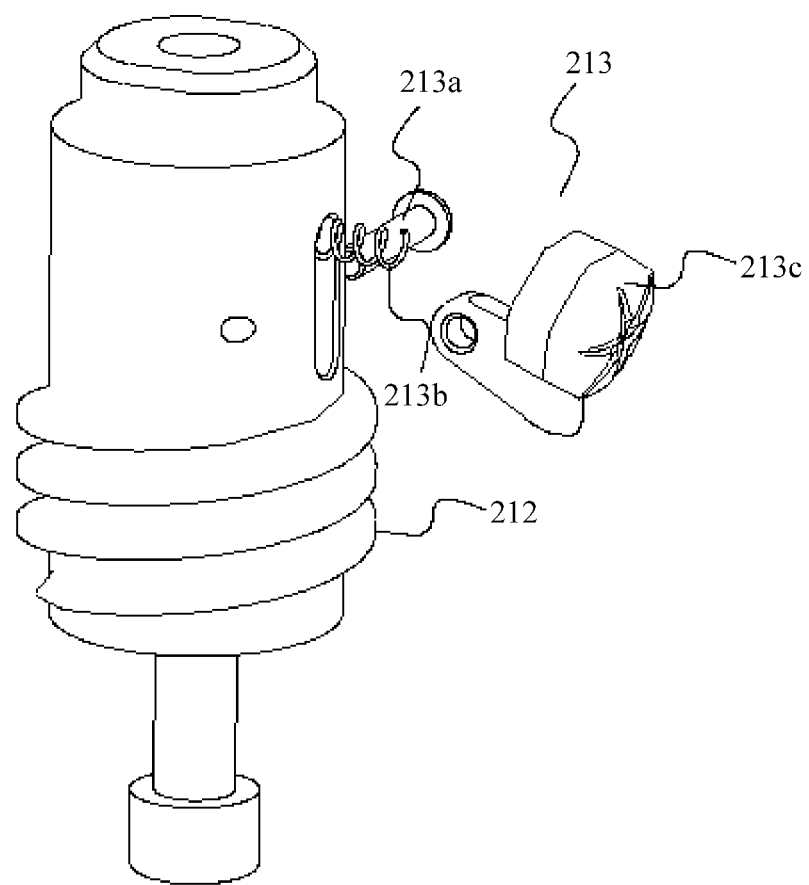
FIG. 12 is a schematic diagram of one end, on which a connection end is disposed, of a first rod of a support frame of the LED display screen system in FIG. 1.
Figure 13:
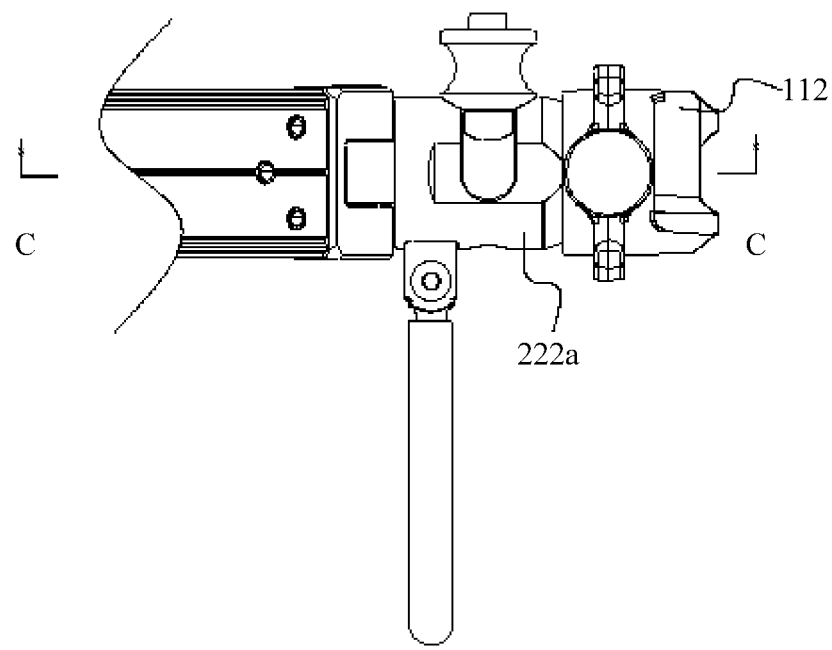
FIG. 13 is a planar diagram of a bracket, connected to a fitting member of a splicing unit, of a support frame of the LED display screen system in FIG. 1.
Figure 14:
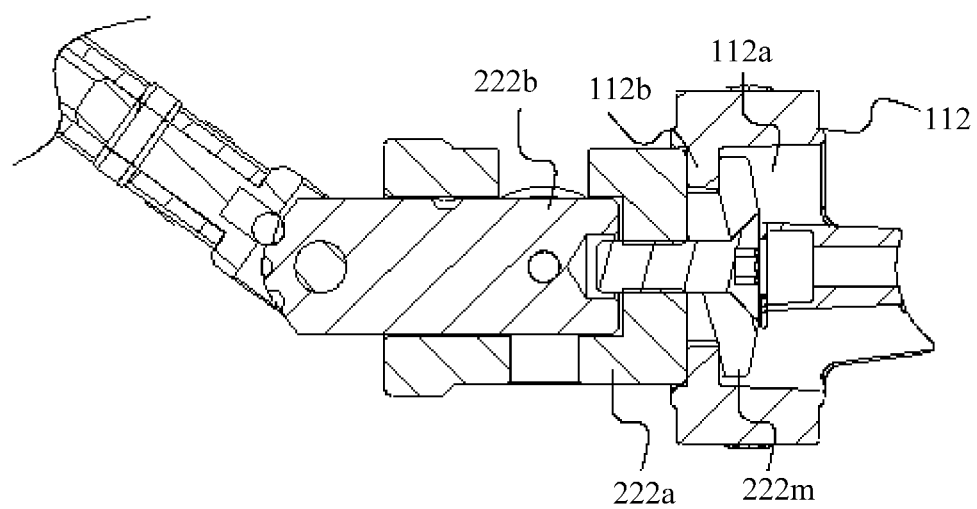
FIG. 14 is a cross-sectional view of a bracket, connected to a fitting member of a splicing unit, of a support frame of the LED display screen system in FIG. 1, where the cross-sectional view is a C-C cross section in FIG. 13.
Figure 15:
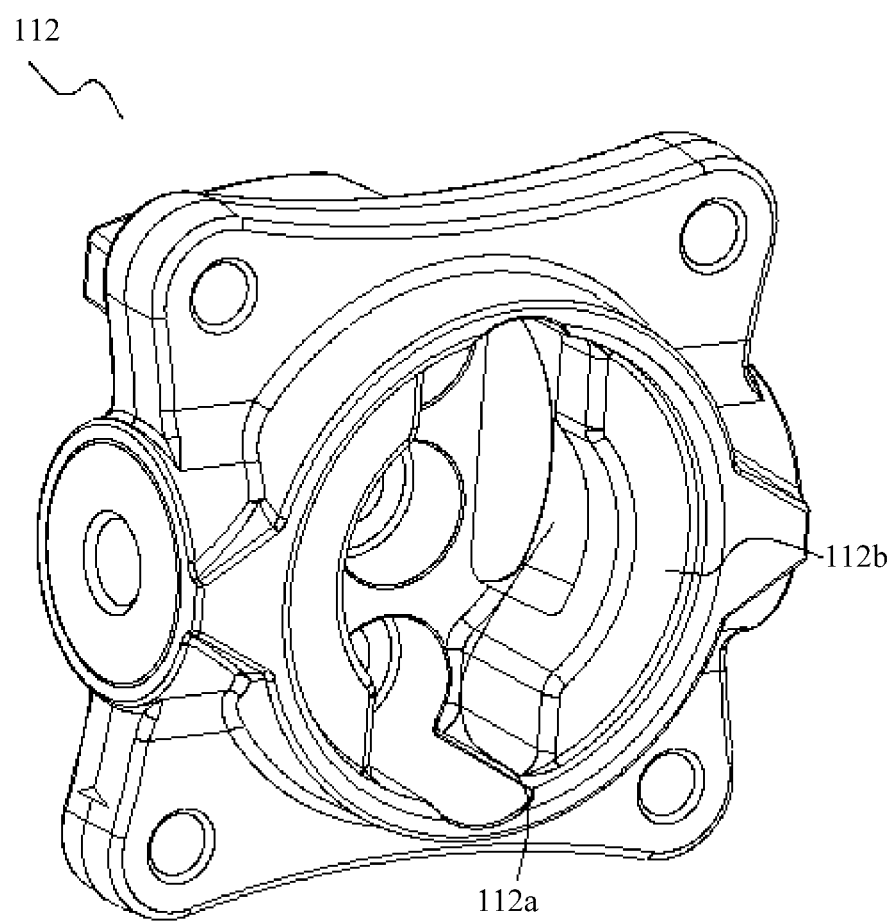
FIG. 15 is a perspective view of the fitting member in FIG. 13.

As shown in FIG. 11 and FIG. 12, one end of the first rod 21 is provided with a connection sleeve 211 and the other end is provided with a connection end 212, and a connection end 212 of one first rod 21 is detachably connected to a connection sleeve 211 of the other first rod 21, so as to connect two support frames 20. Specifically, the connection end 212 of one first rod 21 and the connection sleeve 211 of the other first rod 21 form a threaded connection to connect the two support frames 20. Internal threads are provided on an inner surface of the connection sleeve 211, and external threads are provided on an outer surface of the connection end 212. It can be understood that in other implementations, the end of the connection portion and the connection sleeve may form a variety of detachable connections, such as a magnetic connection and a buckle connection.

In addition, one end of the first rod 21 is further provided with a third positioning portion 213. The third positioning portion 213 is close to the connection sleeve 211 and the connection end 212, and is connected to at least one of the connection sleeve 211 and the connection end 212, so as to fix a position of the connection sleeve 211 and/or the connection end 212 relative to the first rod 21. In this embodiment, the third positioning portion 213 is disposed at a position above the external threads of the connection end 212, and the connection sleeve 211 is provided with a fourth fitting portion 211a cooperating with the third positioning portion 213. After the connection sleeve 211 is connected to the connection end 212, the third positioning portion 213 cooperates with the fourth fitting portion 211a to fix a position of the connection sleeve 211. Specifically, the third positioning portion 213 is a rotation twist, and the third positioning portion 213 includes a positioning shaft 213a, a third biasing member 213b, and a positioning body 213c. The positioning body 213c is rotatably connected to the positioning shaft 213a, the third biasing member 213b is disposed between the positioning shaft 213a and the positioning body 213c, and the third biasing member 213b is specifically a spring. The user rotates the positioning body 213c to change a position of the positioning body 213c, so as to fix or loosen the connection sleeve 213. When no external force is applied to the positioning body 213c, the positioning body 213c always remains in the initial position under the effect of the biasing force of the third biasing member 213b, that is, a position in which the connection sleeve 213 is fixed.

As shown in FIG. 2, and FIG. 13 to FIG. 15, the splicing unit 11 is provided with a fitting member 112, the fitting member 112 and the splicing unit 11 form a fixed connection or are formed integrally, and the fitting member 112 cooperates with the connection portion 222a to form a detachable connection. When the support frame 20 is connected to the splicing unit 11, the connection portion 222a and the fitting member 112 form a rotary connection about the first shaft 222b. The connection portion 222a is provided with a protruding portion 222m in the radial direction of the first shaft 222b, and the fitting member 112 is provided with a cavity 112a in the radial direction of the first shaft 222b. When the connection portion 222a is in the locking position, the protruding portion 222m cooperates with the cavity 112a. In addition, the fitting member 112 is further provided with a stopping portion 112b, and the protruding portion 222m and the stopping portion 112b are relatively fixed in the direction perpendicular to the connection plane of the splicing unit 11 through dimensional interference, or are relatively fixed in the axial direction of the first shaft 222b. In this embodiment, the fitting member 112 is disposed in a central position on a rear side of each splicing unit 11, and the splicing unit 11 is specifically configured to splice a box of the LED display screen 10.

Figure 16:
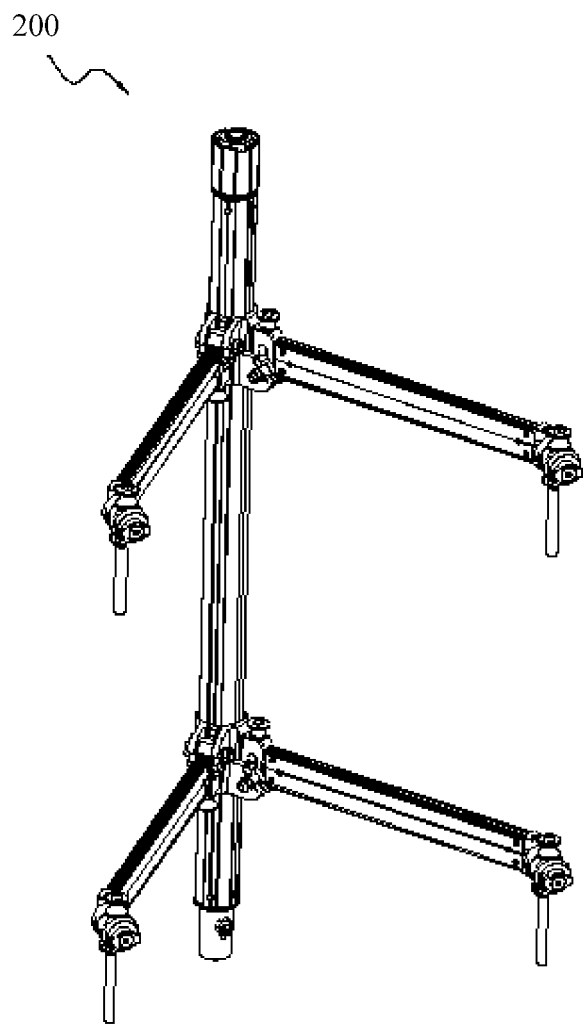
FIG. 16 is a schematic diagram of a support frame for an LED display screen according to another embodiment of this application.

FIG. 16 shows a support frame 200 for an LED display screen according to Embodiment 2 of this application. A specific structure of the support frame is the same as that of the support frame 20 for the LED display screen 10 in Embodiment 1. Details are not described herein again.

Those skilled in the art can easily figure out other implementation solutions of this application after considering the specification and practicing the application disclosed herein. This application is intended to cover any variations, uses, or adaptations of this application, and such any variations, uses, or adaptations follow general principles of this application and include well-known or customary technical means in the art that are not disclosed in this application. It should be understood that this application is not limited to a precise structure described above and shown in the accompanying drawings, and that various modifications and changes may be made without departing from the scope of this application. The scope of this application is limited only by the appended claims, and content of this specification shall not be construed as any limitation to this application.

What is claimed is:

1. A support frame for an LED display screen, wherein the LED display screen comprises a plurality of splicing units that are spliced to each other, and the support frame comprises:
   a first rod extending in a first direction; and
   a bracket, wherein the bracket is connected to the first rod; and
   the bracket comprises:
   a second rod extending in a second direction, wherein one end of the second rod is connected to the first rod; and
   a first connection assembly, wherein the first connection assembly is connected to the other end of the second rod; and
   the first connection assembly comprises:
   a connection portion, configured to form a detachable connection with the splicing unit, wherein the connection portion is disposed at the other end of the second rod, and the connection portion, relative to the splicing unit, has at least a locking position and an unlocking position that are switchable; when the connection portion is in the locking position, the splicing unit and the connection portion are relatively fixed in a direction perpendicular to a connection plane of the splicing unit; and when the connection portion is in the unlocking position, the connection portion is detachable relative to the splicing unit;
   a first positioning portion, wherein when the connection portion is in the locking position, the first positioning portion cooperates with the connection portion and secures the connection portion to the locking position; and
   a first shaft, wherein the connection portion is rotatably connected to the first shaft.

2. The support frame for the LED display screen according to claim 1, wherein the first positioning portion forms a movable connection with the first shaft in a direction perpendicular to an axis of the first shaft.

3. The support frame for the LED display screen according to claim 2, wherein the first connection assembly further comprises a second shaft, wherein the second shaft is connected to the first shaft in a direction perpendicular to the axis of the first shaft, and the first positioning portion is rotatably connected to the second shaft and is movable relative to the second shaft in an axial direction of the first positioning portion.

4. The support frame for the LED display screen according to claim 3, wherein the first connection assembly further comprises a first biasing member, wherein when the first positioning portion moves in a third direction parallel to an axis of the second shaft, the first biasing member applies a biasing force opposite to the third direction to the first positioning portion.

5. The support frame for the LED display screen according to claim 3, wherein a surface of the connection portion is provided with a concave portion, wherein the concave portion is recessed along a radial direction of the first shaft and extends along a circumferential direction of the first shaft, the second shaft passes through the concave portion, and a size of the concave portion along an axial direction of the first shaft is greater than a maximum radial size of the second shaft.

6. The support frame for the LED display screen according to claim 1, wherein a surface of the connection portion is further provided with a first fitting portion, and a surface of the first positioning portion is provided with a second fitting portion; and when the connection portion is in the locking position, the first fitting portion and the second fitting portion form a shaft-hole fit.

7. The support frame for the LED display screen according to claim 1, wherein the support frame further comprises an operating portion configured to perform an operation, and the operating portion is connected to the connection portion and drives the connection portion to switch between the locking position and the unlocking position.

8. The support frame for the LED display screen according to claim 7, wherein the operating portion is rotatably connected to the connection portion, the operating portion rotates about a third shaft, and an axis of the third shaft is perpendicular to an axis of the first shaft.

9. The support frame for the LED display screen according to claim 8, wherein the operating portion is provided with a first gear portion, the connection portion is provided with a second gear portion, and the first gear portion cooperates with the second gear portion, so that the operating portion is fixed to a position when rotating to the position relative to the connection portion.

10. An LED display screen system, comprising:
    an LED display screen, wherein the LED display screen comprises a plurality of splicing units that are spliced to each other; and
    a support frame that is detachably connected to the splicing unit, wherein the support frame comprises:
    a first rod extending in a first direction; and
    a bracket, wherein the bracket is connected to the first rod; and the bracket comprises:
a second rod extending in a second direction, wherein one end of the second rod is connected to the first rod; and
a first connection assembly, wherein the first connection assembly is connected to the other end of the second rod; and
the first connection assembly comprises:
a connection portion, configured to form a detachable connection with the splicing unit, wherein the connection portion is disposed at the other end of the second rod, and the connection portion, relative to the splicing unit, has at least a locking position and an unlocking position that are switchable; when the connection portion is in the locking position, the splicing unit and the connection portion are relatively fixed in a direction perpendicular to a connection plane of the splicing unit; and when the connection portion is in the unlocking position, the connection portion is detachable relative to the splicing unit;
a first positioning portion, wherein when the connection portion is in the locking position, the first positioning portion cooperates with the connection portion and secures the connection portion to the locking position; and
a first shaft, wherein the connection portion is rotatably connected to the first shaft.

11. The LED display screen system according to claim 10, wherein the first positioning portion forms a movable connection with the first shaft in a direction perpendicular to an axis of the first shaft.

12. The LED display screen system according to claim 11, wherein the first connection assembly further comprises a second shaft, wherein the second shaft is connected to the first shaft in a direction perpendicular to the axis of the first shaft, and the first positioning portion is rotatably connected to the second shaft and is movable relative to the second shaft in an axial direction of the first positioning portion.

13. The LED display screen system according to claim 12, wherein the first connection assembly further comprises a first biasing member, wherein when the first positioning portion moves in a third direction parallel to an axis of the second shaft, the first biasing member applies a biasing force opposite to the third direction to the first positioning portion.

14. The LED display screen system according to claim 12, wherein a surface of the connection portion is provided with a concave portion, wherein the concave portion is recessed along a radial direction of the first shaft and extends along a circumferential direction of the first shaft, the second shaft passes through the concave portion, and a size of the concave portion along an axial direction of the first shaft is greater than a maximum radial size of the second shaft.

15. The LED display screen system according to claim 10, wherein a surface of the connection portion is further provided with a first fitting portion, and a surface of the first positioning portion is provided with a second fitting portion; and when the connection portion is in the locking position, the first fitting portion and the second fitting portion form a shaft-hole fit.

16. The LED display screen system according to claim 10, wherein the splicing unit is provided with a fitting member, the fitting member and the splicing unit form a fixed connection or are formed integrally, and the fitting member cooperates with the connection portion to form a detachable connection.

17. The LED display screen system according to claim 16, wherein when the support frame is connected to the splicing unit, the connection portion and the fitting member form a rotary connection about the first shaft; and the connection portion is provided with a protruding portion in a radial direction of the first shaft, the fitting member is provided with a concave portion in the radial direction of the first shaft, and when the connection portion is in the locking position, the protruding portion cooperates with the concave portion.

18. The LED display screen system according to claim 10, wherein the splicing unit is an LED display screen box or an LED display screen module.

\* \* \* \* \*